(12) United States Patent
Giles (10) Patent No.: US 11,802,040 B2
(45) Date of Patent: Oct. 31, 2023

(54) SYSTEM FOR PROTECTING MEMS PRODUCT UNDER ESD EVENT

(71) Applicant: AAC Technologies (Nanjing) Co., Ltd., Nanjing (CN)

(72) Inventor: David Molinero Giles, Irvine, CA (US)

(73) Assignee: AAC Technologies Pte. Ltd., Singapore (SG)

(*) Notice: Subject to any disclaimer, the term of this patent is extended or adjusted under 35 U.S.C. 154(b) by 511 days.

(21) Appl. No.: 17/151,654

(22) Filed: Jan. 18, 2021

(65) Prior Publication Data
US 2022/0227620 A1    Jul. 21, 2022

(51) Int. Cl.
*B81B 7/00* (2006.01)
*B81B 3/00* (2006.01)

(52) U.S. Cl.
CPC .......... *B81B 7/0022* (2013.01); *B81B 3/0086* (2013.01); *B81B 7/0064* (2013.01); *B81B 2201/01* (2013.01)

(58) Field of Classification Search
CPC ....... B81B 7/0022; B81B 7/02; B81B 7/0064; B81B 2203/053; B81B 2203/0145; H01H 59/0009; H01H 2059/0072; H01H 2059/0027
USPC .......................... 200/237, 181; 257/414, 415
See application file for complete search history.

(56) References Cited

U.S. PATENT DOCUMENTS

| | | | | |
|---|---|---|---|---|
| 6,218,205 | B1* | 4/2001 | Michalicek | B81B 7/00 257/659 |
| 6,239,685 | B1* | 5/2001 | Albrecht | H01H 1/0036 337/365 |
| 6,323,445 | B1* | 11/2001 | Yee | H01H 13/702 200/305 |
| 6,329,738 | B1* | 12/2001 | Hung | B81B 3/0037 310/309 |
| 6,467,879 | B1* | 10/2002 | Kubby | B81B 3/0051 347/54 |
| 9,337,653 | B2* | 5/2016 | Brodsky | H02H 9/046 |
| 2003/0094663 | A1* | 5/2003 | Sato | G06V 40/1306 257/419 |
| 2006/0180897 | A1* | 8/2006 | Park | H03H 9/1057 257/664 |
| 2012/0103768 | A1* | 5/2012 | Bachman | H01G 5/18 29/592.1 |

(Continued)

Primary Examiner — William A Bolton
(74) Attorney, Agent, or Firm — W&G Law Group (57) ABSTRACT

The present invention discloses a system for protecting a MEMS product from an ESD event, including, a control circuit; a MEMS product, electrically connected with the control circuit; an ESD protection device, electrically connected with the control circuit, and electrically connected with the MEMS product in parallel; wherein, the ESD protection device comprises: a top electrode assembly electrically connected with the control circuit; a flexible beam comprising a first electrode layer electrically connected with the control circuit, a second electrode layer electrically connected with the MEMS product, and a moving metal contact electrically connected with the second electrode layer; a bottom electrode assembly having a bottom electrode layer electrically connected with the MEMS product and a fixed metal contact electrically connected with the bottom electrode layer and facing the moving metal contact.

11 Claims, 8 Drawing Sheets

(56) References Cited

U.S. PATENT DOCUMENTS

2014/0264645 A1\* 9/2014 Daneman .............. B81B 3/0056
  257/415

\* cited by examiner

SYSTEM FOR PROTECTING MEMS PRODUCT UNDER ESD EVENT

FIELD OF THE PRESENT DISCLOSURE

The present invention relates generally to a system. More particularly, this invention relates to a system for protecting MEMS product under electrostatic discharge event.

DESCRIPTION OF RELATED ART

A major reliability for many integrated circuits (ICs) is electrostatic discharge (ESD), especially, for MEMS product, such as RF MEMS switch. During an ESD event, a large amount of charge is transferred from one object to another in a relatively short period of time, which results in a peak current that can cause significant damage to the IC.

Therefore, it is necessary to provide a new electrostatic discharge protection system for solving above mentioned problem.

SUMMARY

In one aspect of the present disclosure, a system for protecting a MEMS product from an ESD event, comprises, a control circuit; a MEMS product, electrically connected with the control circuit; an ESD protection device, electrically connected with the control circuit, and electrically connected with the MEMS product in parallel; wherein, the ESD protection device comprises: a top electrode assembly electrically connected with the control circuit; a flexible beam comprising a first electrode layer electrically connected with the control circuit, a second electrode layer electrically connected with the MEMS product, and a moving metal contact electrically connected with the second electrode layer; a bottom electrode assembly having a bottom electrode layer electrically connected with the MEMS product and a fixed metal contact electrically connected with the bottom electrode layer and facing the moving metal contact.

DETAILED DESCRIPTION OF THE EXEMPLARY EMBODIMENTS

Hereinafter, the present disclosure will be further described with reference to the accompanying drawings and embodiments.

Figure 1:
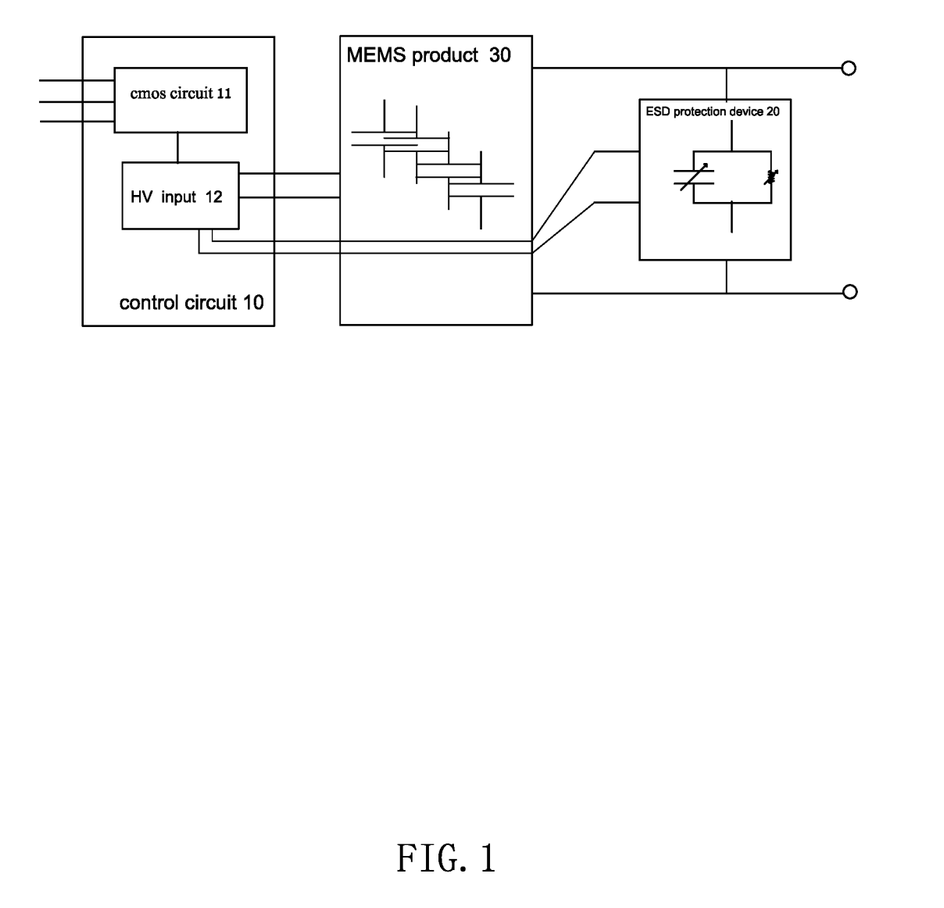
FIG. 1 is a schematically block diagram of a system for protecting a MEMS product from an ESD event according to the present disclosure.
Figure 2:
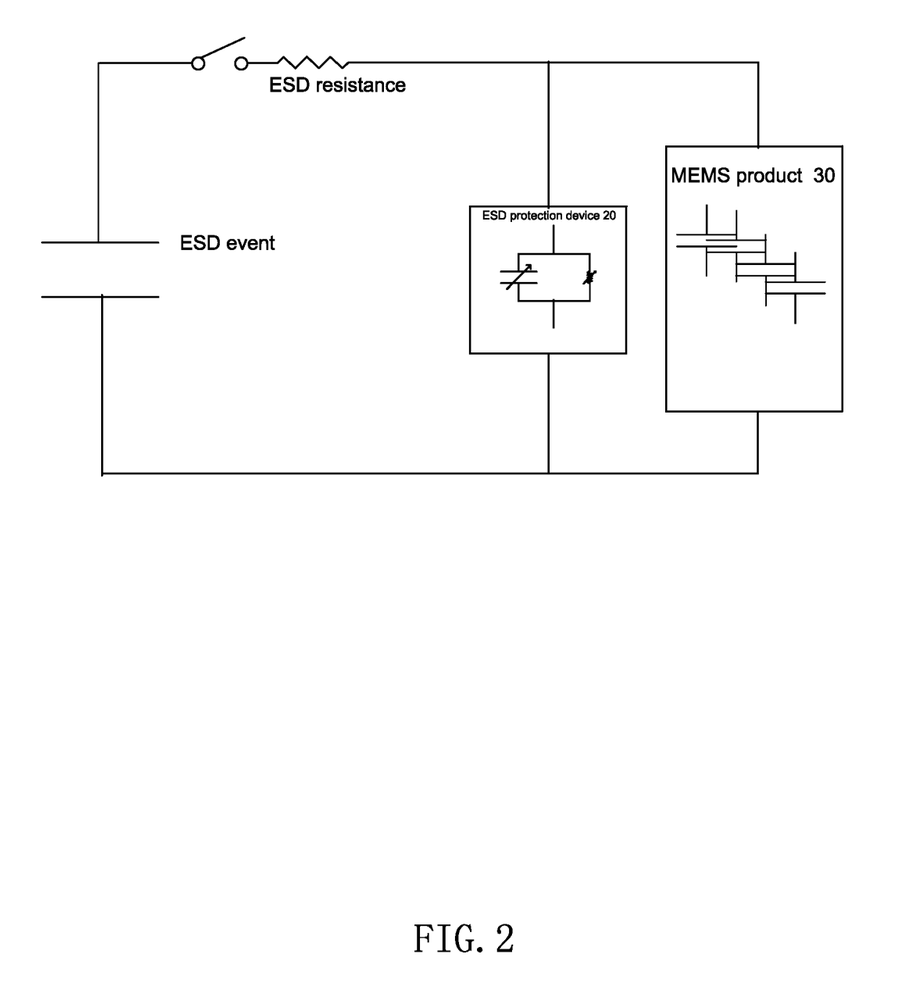
FIG. 2 is a schematically block diagram of the system shown in FIG. 1 under the ESD event.

As shown in the FIG. 1 and FIG. 2, a system 100 for protecting a MEMS product under an ESD event according to the present disclosure, comprises: a control circuit 10, an ESD protection device 20 and a MEMS product 30, both the MEMS product 30 and the ESD protection device 20 electrically connected with the control circuit 10, and the MEMS product 30 is electrically connected with the ESD protection device 20 in parallel. The ESD protection device 20 has a faster response time than that of the MEMS product 30 while under an ESD event. Therefore, the ESD protection device 20 dissipates voltage/charge fast under the ESD event, and thus, the MEMS product 30 is protected from electrostatic discharge.

As shown in FIG. 3 through FIG. 6, the ESD protection device 20 includes a housing 21 having a cavity 200, a top electrode assembly 22 fixed to the housing 21, a bottom electrode assembly 23 fixed to the housing 21 and spaced apart from the top electrode assembly 22, and a beam 24 disposed between the top electrode assembly 22 and the bottom electrode assembly 23 and elastically supported by the housing 21.

The housing 21 includes a top wall 211, a bottom wall 212, and a side wall 213 connected between the top wall 211 and the bottom wall 212. The top wall 211, the bottom wall 212 and the side wall 213 cooperatively form the cavity 200. The top electrode assembly 22 is fixed to the top wall 211. The bottom electrode assembly 23 is fixed to the bottom wall 212. The beam 24 is flexible and elastically connected with the side wall 213. The cavity 200 is sealed under a known pressure.

The top electrode assembly 22 includes a plurality of upper electrodes 221 electrically connected with the control circuit 10, an upper oxide layer 222 encapsulating the electrodes 221 and at least one bump 223 protruding from the oxide layer 222 toward the beam 24 for contacting the beam 24.

The bottom electrode assembly 23 includes a bottom electrode layer 231 fixed to the bottom wall 212, a bottom oxide layer 232 encapsulating the bottom electrode layer 231, and a fixed metal contact 233 extending outward from the bottom oxide layer 232. One end of the fixed metal contact 233 is electrically connected with the bottom electrode layer 231, and another end thereof is grounded.

The beam 24 includes a first electrode layer 241, a second electrode layer 242, a first oxide layer 243 encapsulating the first electrode layer 241, a second oxide layer 244 encapsulating the second electrode layer 242, and a moving metal contact 245 electrically connected with second electrode layer 242 and facing the fixed metal contact 233. The moving metal contact 245 is exposed out of the second oxide layer 244. The moving metal contact 245 may be a single one metal contact, or may comprise several metal contacts and alloys.

The control circuit 10 includes a CMOS circuit 11 and high voltage input 12. The high voltage input 12 is electrically connected with the CMOS circuit 11. The top electrodes 211 include first top electrodes 2211 and second top electrodes 2212 spaced apart from the first top electrodes 2211. The high voltage input 12 is electrically connected with the first top electrodes 2211 and the second top electrodes 2212. The first electrode layer 241 of the beam 24 is also electrically connected with the high voltage input 12. The CMOS circuit 11 is configured to apply the high voltage to the MEMS product 30 or the ESD protection device 20. The second electrode layer 242 and the bottom electrode layer 231 are electrically connected with the MEMS product 30 in parallel. For example, the MEMS product 30 may be a RF MEMS product having a RF beam, the second electrode layer 242 and the bottom electrode layer 231 may be electrically connected with the RF beam of the RF MEMS product in parallel.

Figure 4:
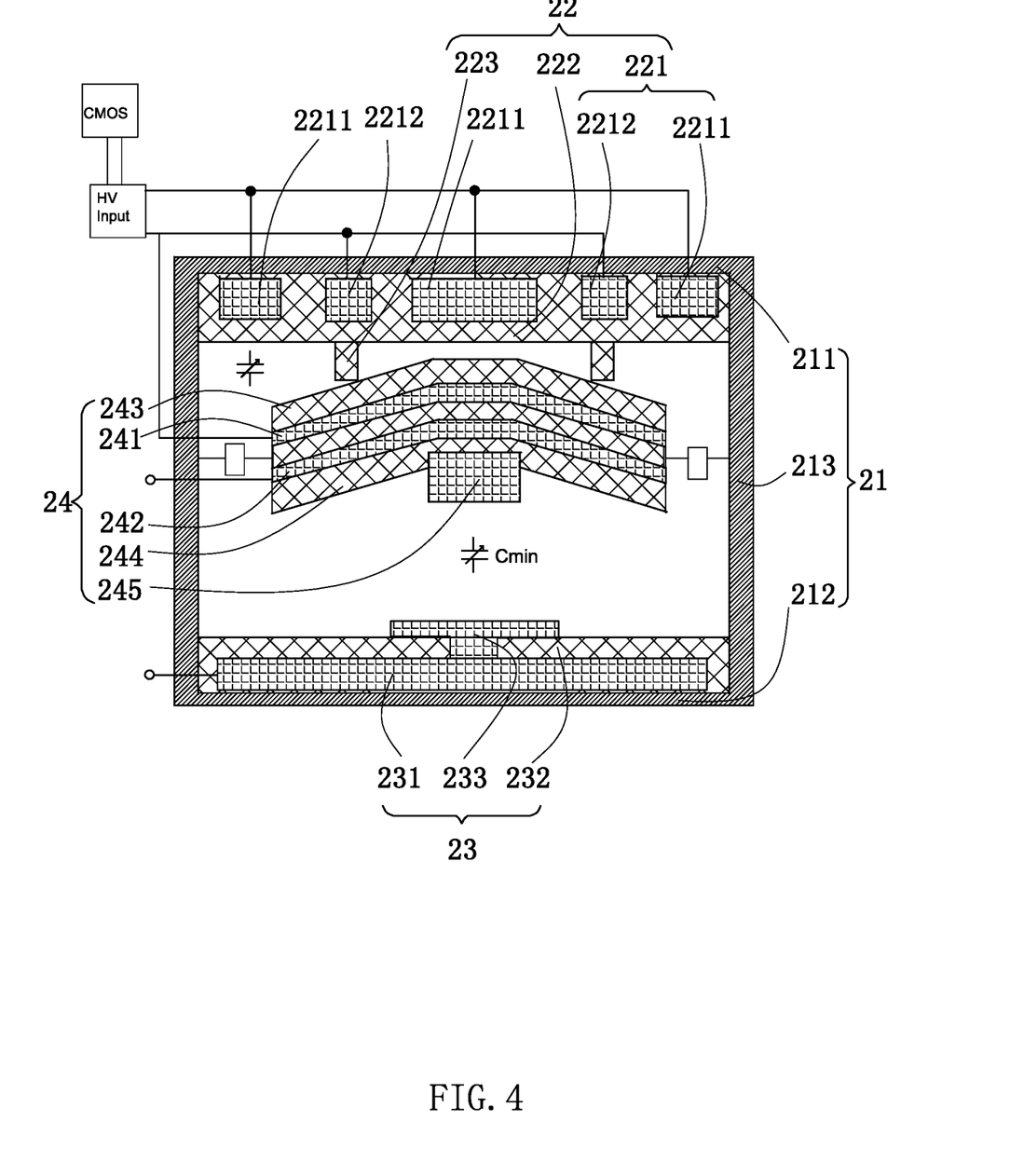
FIG. 4 is the schematically cut-away view of the ESD protection device of the system in an isolation state.

When the MEMS product 30 is in normal operation, the control circuit 10 input a current or voltage into the top electrode assembly 21 and the first electrode layer 241, respectively, then, an attractive force is formed between the top electrode assembly 21 and the first electrode layer 241, so that the beam 24 is pulled up, and a gap between the beam 24 and the bottom electrode assembly 23 increased, and thus, an isolation state is created. In the isolation state, the first oxide layer 243 of the beam 24 contacts the bumps 223. With such configuration, since the top electrodes create a perfect isolation and minimal parasitic capacitance, with minimal influence into the product capacitance. A minimum capacitor is formed between the moving metal contact 245 and the fixed metal contact 233.

Figure 3:
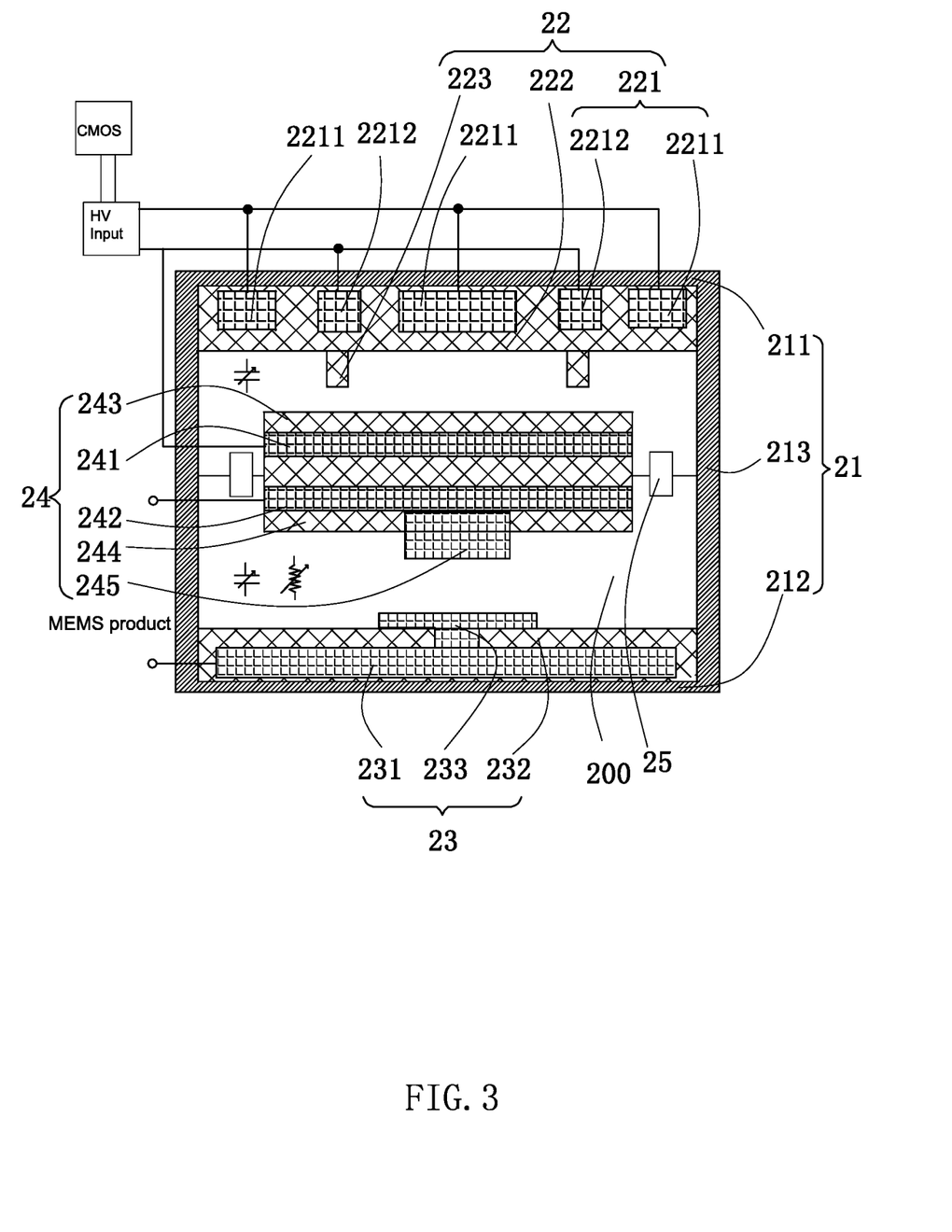
FIG. 3 is a schematically cut-away view of the ESD protection device of the system in a protection state according to one embodiment.

When the product is not in operation or not electrically connected, the system is in a protection state, the beam 24 is left free standing, in a release station.

Figure 5:
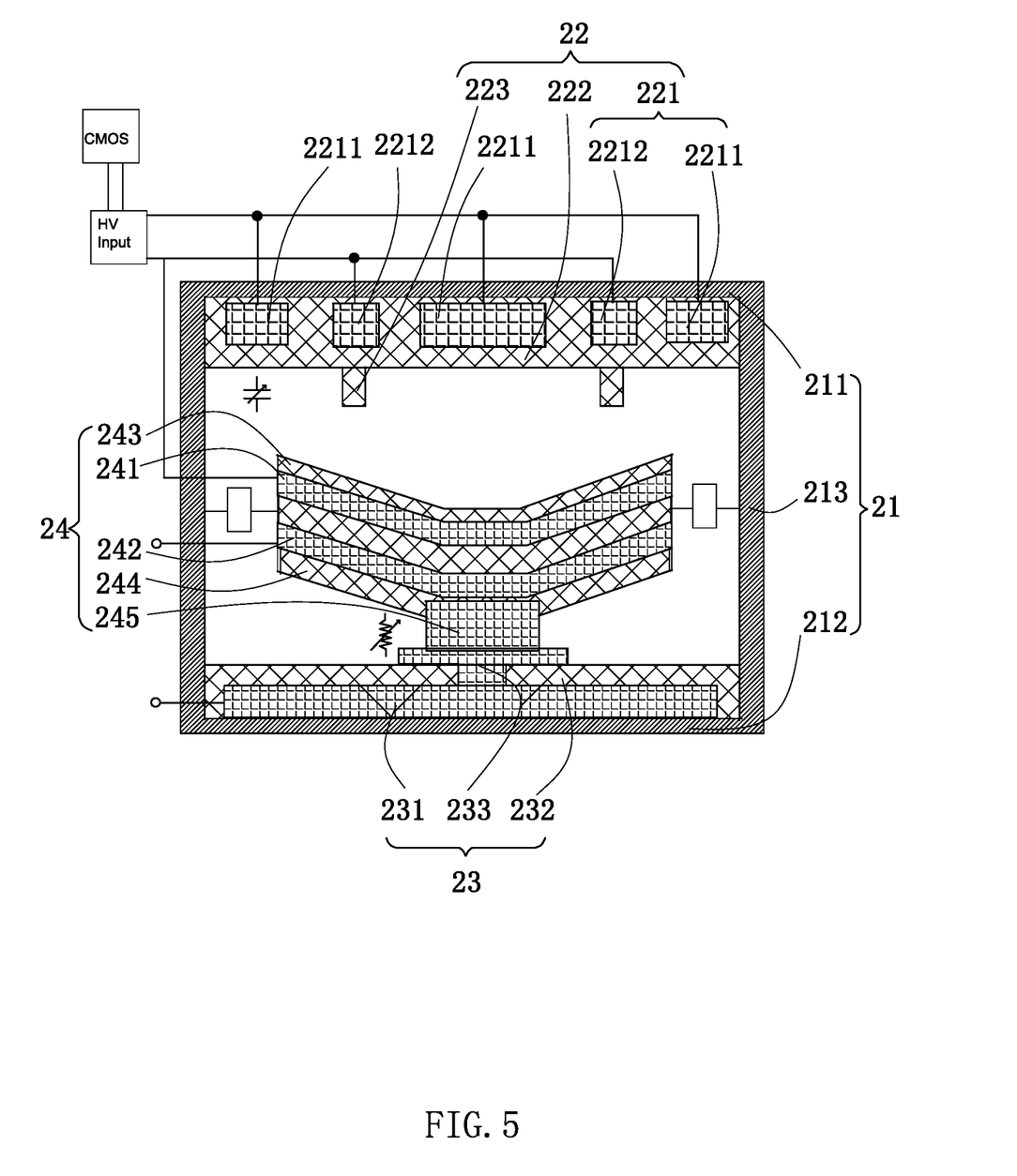
FIG. 5 is the schematically cut-away view of the ESD protection device of the system under the ESD event.

When the system is under an ESD event, an electrostatic force applied to the second electrode layer 244 pulls the beam 24 down, so that the moving metal contact 245 contacts the fixed metal contact 234 to form an ohmic contact, and then, the ESD voltage/charge is dissipating via the ohmic contact. The beam 24 collapses much faster than the MEMS product 30. The ESD charge is grounded via the fixed metal contact 234.

When the ESD charge is dissipated through 233 or 242, the electrostatic force is reduced, the beam 24 may be released and back to the protection state.

Figure 6:
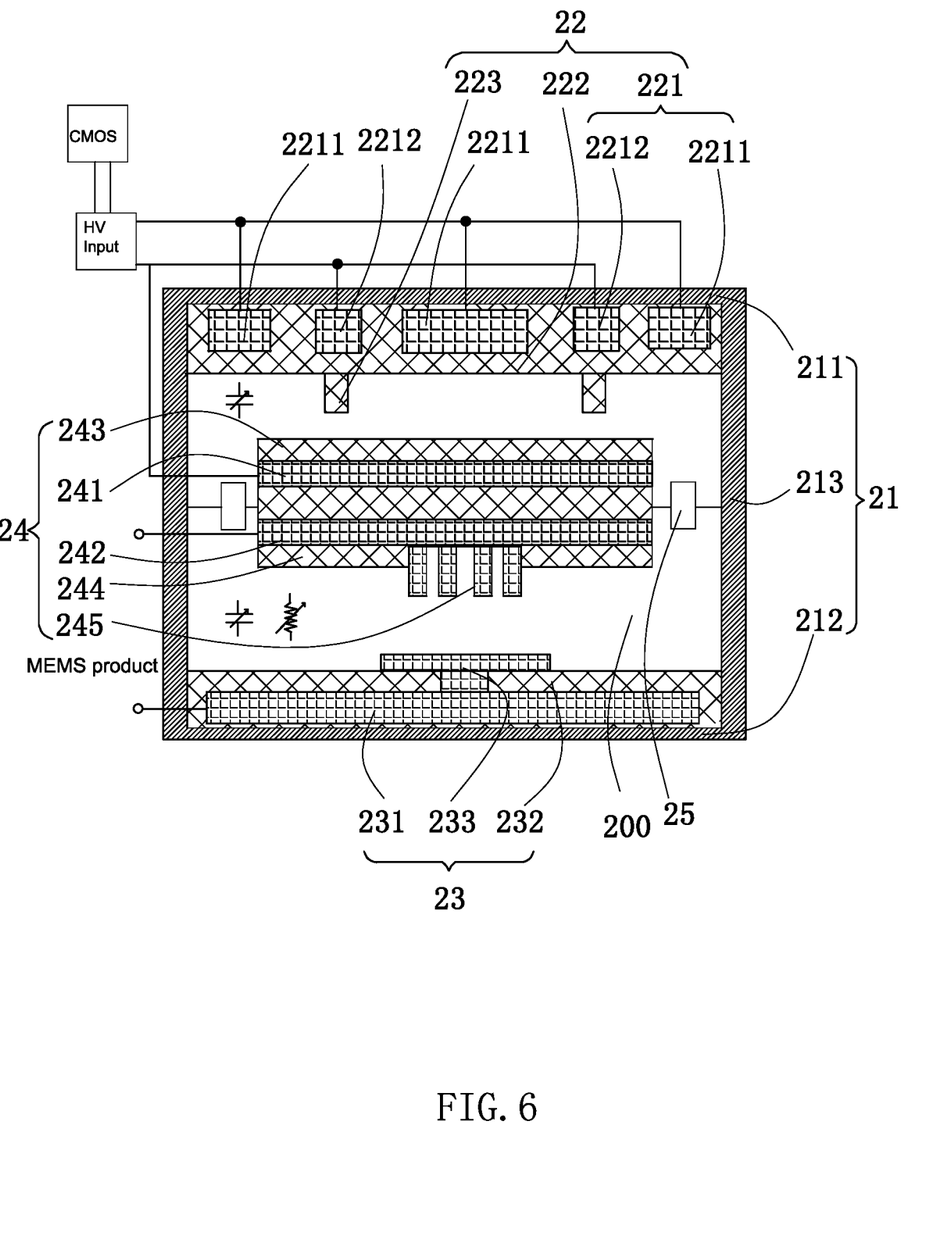
FIG. 6 is a schematically cut-away view of the ESD protection device of the system according to another embodiment.
Figure 7:
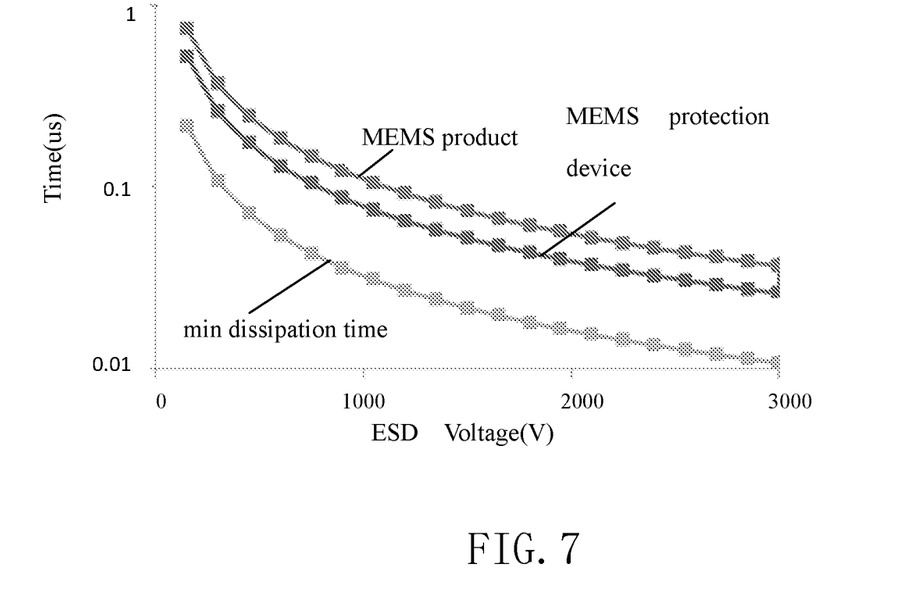
FIG. 7 shows a switching time of the ESD protection device, MEMS product and the difference between them as a function of ESD voltage.

In other embodiment, the ESD protection device 20 further includes a flexible member 25 for elastically connected the beam 24 with side wall 213. For example, the flexible member 25 may be a loop spring.

In other embodiment, an area of the beam 24 of the ESD protection device 20 is larger than that of the MEMS product 30. When the area increased, the time to dissipate the ESD charge by the ESD protection device 20 will be faster. As shown in Table 1, the ESD protection device 20 has a ESD MEMS beam, which has an area at least twice to the beam of RF MEMS.

TABLE 1

|  | RF MEMS product | ESD protection device |
|---|---|---|
| Gap Free (μm) | 1 | 1 |
| Pull-up gap(μm) | 2.5 | 2.5 |
| Area | 3.00E−09 | 6.00E−09 |
| Contact resistance(ohm) | — | 1000 |
| Number of beams | 14 | — |
| Cmin pull-up | 172.8 | — |
| Cmax | 3510.84 | — |
| VSA | 13.66 | 9.66 |
| Resonant(KHz) | 72 | 72 |
| ESD Voltage (V) | 1500 | 1500 |
| ESD Capacitance (pF) | 100 | 100 |
| ESD Resistance (ohm) | 1500 | 15000 |
| Max ESD peak | 1 | 1 |
| Switch time(μs) | 0.0739 | 0.0522 |
| RF MEMS-ESD time |  | 0.0216 |

TABLE 1-continued

|  | RF MEMS product | ESD protection device |
|---|---|---|
| Charge dissipation (μs) |  | 0.100432 |
| Contact current (A) |  | 1.5 |

As shown in the table 1, when the system is unpowered and under a 1500V ESD event, the RF MEMS switching time is about 0.074 B and the switching time of the ESD protection device is about 0.054 s. The beam of the ESD protection device will react first than the RF MEMS product, and the time for dissipating the ESD charge is 0.0216 μs. If the contact resistance of the beam is 1000 ohm, the dissipating time may be around 0.1 μs. Thus, if a faster dissipating time is required, the lower contact resistance or higher area of the ESD protection device is required. As shown in FIG. 6, the switching time of the ESD protection device, MEMS product and the difference between them as a function of ESD voltage. As shown in FIG. 6, the switching time reduced as the ESD voltage increased.

Figure 8:
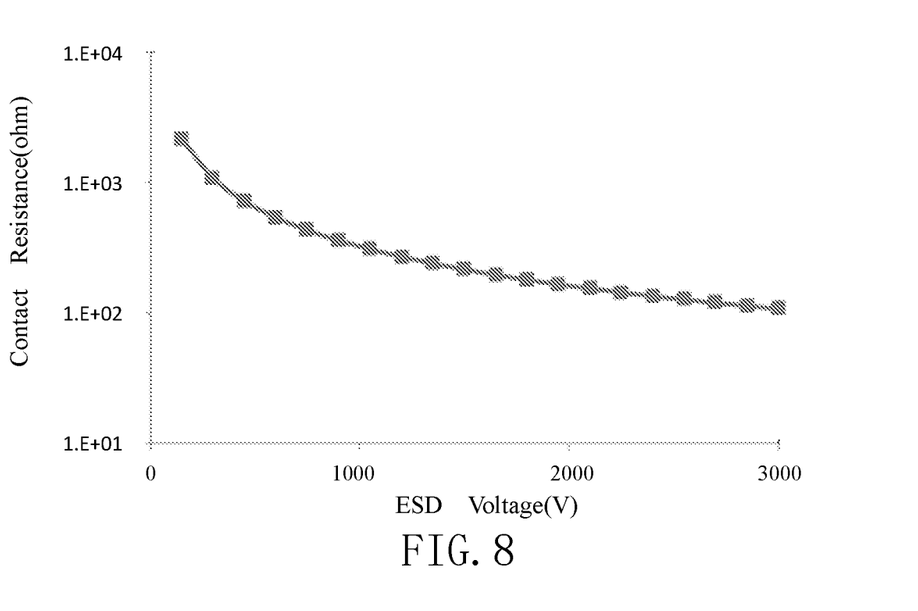
FIG. 8 shows a minimum contact resistance needed to dissipate the ESD voltage considering the minimum dissipation time shown in FIG. 6.

As shown in FIG. 8, the minimum contact resistance needed to dissipate the ESD voltage considering the minimum dissipation time show in FIG. 5. For example, under a 1500V ESD event, a contact resistance of 200 ohm is required to dissipate the voltage by the ESD protecting device.

Figure 9:
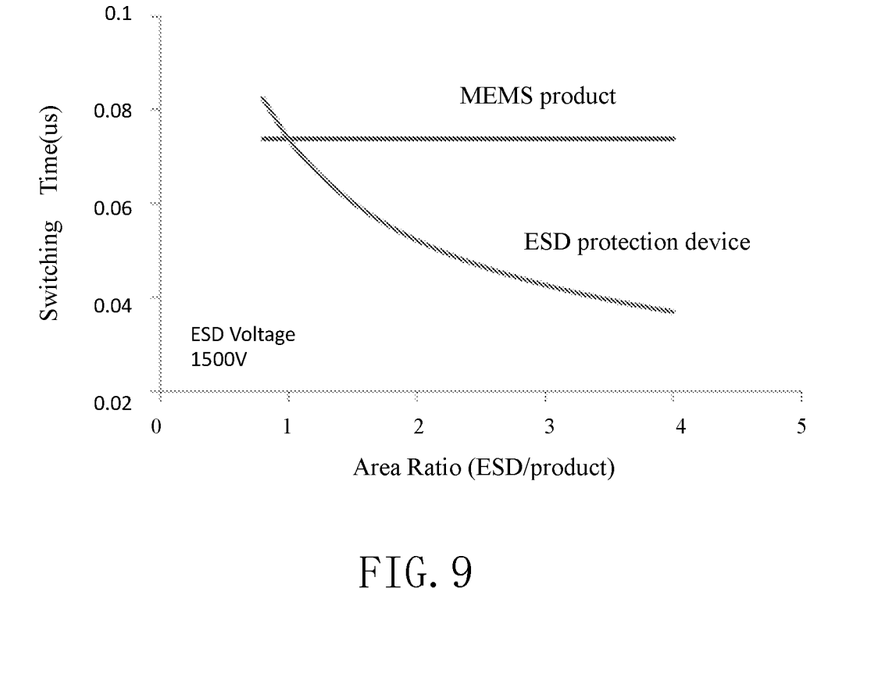
FIG. 9 shows switching time of both the MEMS product and the ESD protection device as function of the area ratio between them.

FIG. 9 shows a switching time of both the MEMS product and the ESD protection device as function of the area ratio between them. As shown in FIG. 9, the switching time of the MEMS product is consistent as the area ratio increase, and the switching time of the ESD Protection device is reduced as the area ratio increase.

The above is only the embodiment of the present invention, but not limit to the patent scope of the present disclosure, and the equivalent structures or equivalent process transformations made by utilizing the present disclosure and the contents of the drawings, or directly or indirectly applied to other related technology fields, are all included in the scope of the patent protection of the present disclosure.

What is claimed is:

1. A system for protecting a MEMS product from an ESD event, comprising, a control circuit;
    a MEMS product, electrically connected with the control circuit;
    an ESD protection device, electrically connected with the control circuit, and electrically connected with the MEMS product in parallel; wherein, the ESD protection device comprises:
    a top electrode assembly electrically connected with the control circuit;
    a flexible beam comprising a first electrode layer electrically connected with the control circuit, a second electrode layer electrically connected with the MEMS product, and a moving metal contact electrically connected with the second electrode layer;
    a bottom electrode assembly having a bottom electrode layer electrically connected with the MEMS product and a fixed metal contact electrically connected with the bottom electrode layer and facing the moving metal contact.

2. The system according to claim 1, wherein, the ESD protection device further comprises a housing having a cavity, the beam received in the cavity and elastically supported by the housing.

3. The system according to claim 2, wherein, the housing comprises a top wall, a bottom wall and a side wall connected between the top wall and the bottom wall, the top electrode assembly fixed to the top wall, the bottom electrode assembly fixed to the bottom wall, the beam fixed to the side wall.

4. The system according to claim 3, wherein, the ESD protection device further comprises a flexible member, one end of the flexible member is connected with the beam, and the other end of the flexible member is connected with the side wall.

5. The system according to claim 1, wherein, the top electrode assembly comprises a plurality of top electrodes spaced apart from each other, a top oxide layer encapsulating the top electrodes and at least one bump protruding toward the beam from the top oxide layer.

6. The system according to claim 5, wherein, the beam further comprises a first oxide layer encapsulating the first electrode layer and a second oxide layer encapsulating the second electrode layer, the moving metal contact exposed out of the second oxide layer.

7. The system according to claim 6, wherein, the first oxide layer and the second oxide layer are formed integrally.

8. The system according to claim 6, wherein, the bottom electrode assembly further comprises a bottom oxide layer encapsulating the bottom electrode layer, and the fixed metal contact exposed out of the bottom oxide layer.

9. The system according to claim 1, wherein, an area of the beam of the ESD protection device is larger than that of the MEMS product.

10. The system according to claim 1, wherein, a contact resistance between the moving metal contact and the fixed metal contact is lower than that of the MEMS product.

11. The system according to claim 1, wherein, the control circuit comprises a CMOS circuit and a high voltage input electrically connected with the CMOS circuit; the MEMS product and the ESD protection device both electrically connected with the high voltage input, and the CMOS circuit is configured to control the high voltage input to be electrically connected with the MEMS product or the ESD protection device.

* * * * *